US009935265B2

(12) United States Patent
Chang et al.

(10) Patent No.: US 9,935,265 B2
(45) Date of Patent: Apr. 3, 2018

(54) RESISTIVE RANDOM ACCESS MEMORY

(71) Applicant: NATIONAL SUN YAT-SEN UNIVERSITY, Kaohsiung (TW)

(72) Inventors: Ting-Chang Chang, Kaohsiung (TW); Kuan-Chang Chang, Kaohsiung (TW); Tsung-Ming Tsai, Kaohsiung (TW); Chih-Hung Pan, Kaohsiung (TW); Po-Hsun Chen, Kaohsiung (TW)

(73) Assignee: National Sun Yat-Sen University, Kaohsiung (TW)

( * ) Notice: Subject to any disclaimer, the term of this patent is extended or adjusted under 35 U.S.C. 154(b) by 0 days.

(21) Appl. No.: 15/291,117

(22) Filed: Oct. 12, 2016

(65) Prior Publication Data

US 2017/0346004 A1    Nov. 30, 2017

(30) Foreign Application Priority Data

May 27, 2016    (TW) .............................. 105116649 A

(51) Int. Cl.
*H01L 45/00*    (2006.01)

(52) U.S. Cl.
CPC .......... *H01L 45/1253* (2013.01); *H01L 45/14* (2013.01)

(58) Field of Classification Search
CPC ............................ H01L 45/1253; H01L 45/14
USPC .......................................................... 257/4, 2
See application file for complete search history.

(56) References Cited

U.S. PATENT DOCUMENTS

| 2011/0186802 A1* | 8/2011 | Yukawa | B82Y 10/00 257/4 |
| 2014/0117303 A1* | 5/2014 | Wang | H01L 45/145 257/4 |
| 2014/0175356 A1* | 6/2014 | Wang | H01L 45/1293 257/2 |

* cited by examiner

*Primary Examiner* — Cuong Q Nguyen
*Assistant Examiner* — Tong-Ho Kim
(74) *Attorney, Agent, or Firm* — Alan D. Kamrath; Kamrath IP Lawfirm, P.A.

(57) ABSTRACT

A resistive random access memory overcomes the low reliability of the conventional resistive random access memory. The resistive random access memory includes a resistance changing layer and two electrode layers. The two electrode layers are coupled with the resistance changing layer. Each of the two electrode layers includes a doping area containing a heavy element. In such an arrangement, the above deficiency can be overcome.

4 Claims, 2 Drawing Sheets

RESISTIVE RANDOM ACCESS MEMORY

CROSS REFERENCE TO RELATED APPLICATIONS

The application claims the benefit of Taiwan application serial No. 105116649, filed on May 27, 2016, and the subject matter of which is incorporated herein by reference.

BACKGROUND OF THE INVENTION

1. Field of the Invention

The present disclosure generally relates to a resistive random access memory and, more particularly, to a resistive random access memory having its electrode layers doped with a heavy element.

2. Description of the Related Art

Memories have been widely used in various electronic products. Due to the increasing need of data storage, the demands of the capacities and performances of the memories become higher and higher. Among various memory elements, resistive random access memories (RRAMs) have an extremely low operating voltage, an extremely high read/write speed, and high miniaturization of the element size and, thus, may replace the conventional flash memories and dynamic random access memories (DRAMs) as the main stream of memory elements of the next generation.

A conventional resistive random access memory includes two electrode layers and a resistance changing layer. The resistance changing layer is sandwiched between the two electrode layers to form a metal-dielectric-metal (MIM) structure. An electric field may be applied to control the oxidation and reduction reactions of the metal filament in the resistance changing layer, thereby switching the resistance changing layer between a low resistance state (LRS) and a high resistance state (HRS). The low and high resistance states can be used to store the logic states of "0" and "1," respectively.

However, the oxygen ions in the resistance changing layer always move around during the operation of the resistive random access memory. As the resistive random access memory operates a larger and larger number of times, the moving oxygen ions will gradually damage the memory. As a result, the reliability of the resistive random access memory is low.

In light of this, the conventional resistive random access memory does have some deficiency when in use. Therefore, it is necessary to improve the conventional resistive random access memory.

SUMMARY OF THE INVENTION

It is therefore the objective of this disclosure to provide a resistive random access memory with a higher reliability.

In an embodiment, a resistive random access memory which can include a resistance changing layer and two electrode layers is disclosed. The two electrode layers are coupled with the resistance changing layer. Each of the two electrode layers includes a doping area containing a heavy element.

In a form shown, the doping area may be located at a part of the electrode layer relatively adjacent to the resistance changing layer. The doping area is in a form of a layer. The heavy element may be lanthanum, cerium, praseodymium, neodymium, promethium, samarium, europium, gadolinium, terbium, dysprosium, holmium, erbium, thulium, ytterbium, lutetium, hafnium, tantalum, tungsten, rhenium, osmium, iridium, platinum, gold, mercury, thallium, plumbum or any combination thereof. Each of the two electrode layers may be a multi-layer structure. In this arrangement, the heavy element in the doping area can prevent the oxygen ions of the resistance changing layer from impairing the resistive random access memory, improving the reliability and prolonging the service life of the resistive random access memory.

In the resistive random access memory above, each electrode layer includes a doping area that is doped with the heavy element in order to prevent the oxygen ions of the resistance changing layer from impairing the resistive random access memory. Thus, correct determination of the resistance state can be ensured, and the reliability of said memory can be improved. The disadvantage of low reliability of the conventional resistive random access memory is overcome.

BRIEF DESCRIPTION OF THE DRAWINGS

The present disclosure will become more fully understood from the detailed description given hereinafter and the accompanying drawings which are given by way of illustration only, and thus are not limitative of the present disclosure, and wherein.

Figure 1:
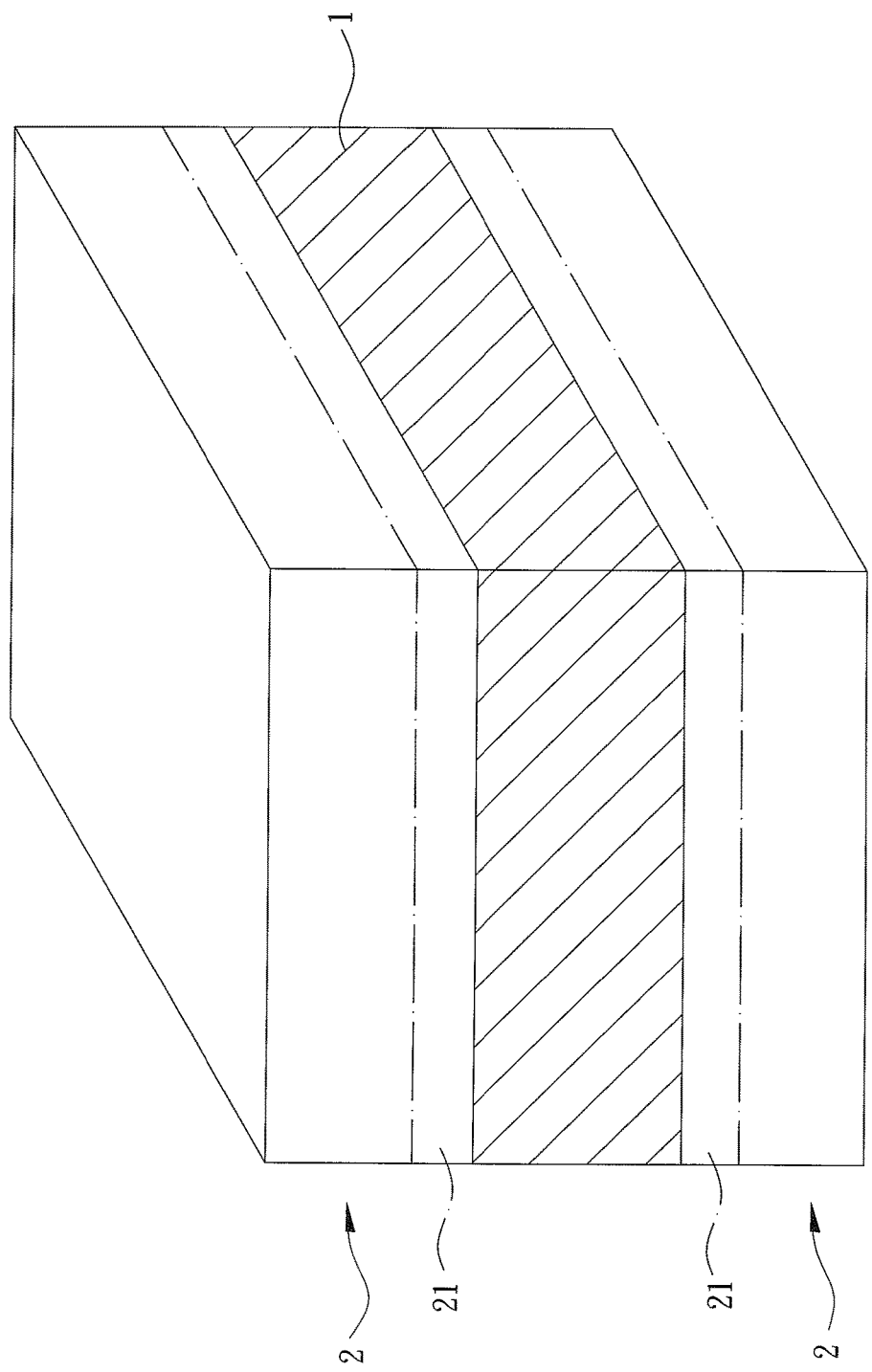
FIG. 1 shows a resistive random access memory according to an embodiment of the disclosure.

In the various figures of the drawings, the same numerals designate the same or similar parts. Furthermore, when the terms "first", "second", "third", "fourth", "inner", "outer", "top", "bottom", "front", "rear" and similar terms are used hereinafter, it should be understood that these terms have reference only to the structure shown in the drawings as it would appear to a person viewing the drawings, and are utilized only to facilitate describing the disclosure.

DETAILED DESCRIPTION OF THE INVENTION

The "heavy element" mentioned hereinafter refers to an element whose atomic number is larger than lanthanum (having an atomic number of 57), as it can be readily appreciated by the person having ordinary skill in the art.

FIG. 1 shows a resistive random access memory according to an embodiment of the disclosure. The resistive random access memory may include a resistance changing layer 1 and two electrode layers 2 coupled with the resistance changing layer 1. In the embodiment, the resistance changing layer 1 may consist of the oxygen-containing, insulating material such as silicon dioxide or hafnium oxide. However, this is not used to limit the disclosure. Each electrode layer 2 may be made of an electrically conductive material such as indium tin oxide (ITO) or titanium nitride (TiN). In addition, each electrode layer 2 may be in a single-layer or a multi-layer structure. Each electrode layer 2 may include a doping area 21 which can contain a heavy element such as lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), hafnium (Hf), tantalum (Ta), tungsten (W), rhenium (Re), osmium (Os), iridium (Ir), platinum (Pt), gold (Au), mercury (Hg), thallium (Tl), plumbum (Pb) or any combination thereof. As such, the electrode layer 2 forms a 3D structure having the heavy element, preventing the oxygen ions in the resistance changing layer 1 from impairing the resistive random access memory. The doping area 21 may be adjacent to the interface between the electrode layer 2 and the resistance changing layer 1. The heavy element in the doping area 21 may gather as a layer form to improve the separation effect of the oxygen ions. An example of the doping area 21 doped with gadolinium is described below, but it is not used to limit the disclosure.

Referring to FIG. 1, during the use of the resistive random access memory according to the embodiment of the disclosure, an electric field (not shown) may be applied between the two electrode layers 2 to cause oxidization and reduction reactions of the oxygen ions of the resistance changing layer 1. This causes the resistance changing layer 1 to switch between the high and low resistance states. It is noted that each electrode layer 2 has the doping area 21 that is doped with the heavy element. In this regard, if the oxygen ions in the resistance changing layer 1 gradually approach the electrode layer 2 after the resistive random access memory has operated a large number of times, the heavy element in the doping area 21 can protect the resistive random access memory from damage caused by the oxygen ions bumping into the heavy element. Specifically, the heavy element in the doping area 21 has a much larger mass than that of the oxygen ions. Thus, based on the principle of a completely inelastic collision, the collided element (heavy element) is able to absorb the kinetic energy of the colliding ions (oxygen ions) if the mass of the collided element is much larger than that of the colliding ions. As a result, damage to the resistive random access memory can be prevented, the reliability thereof can be improved, and the service life thereof can be prolonged.

Figure 2:
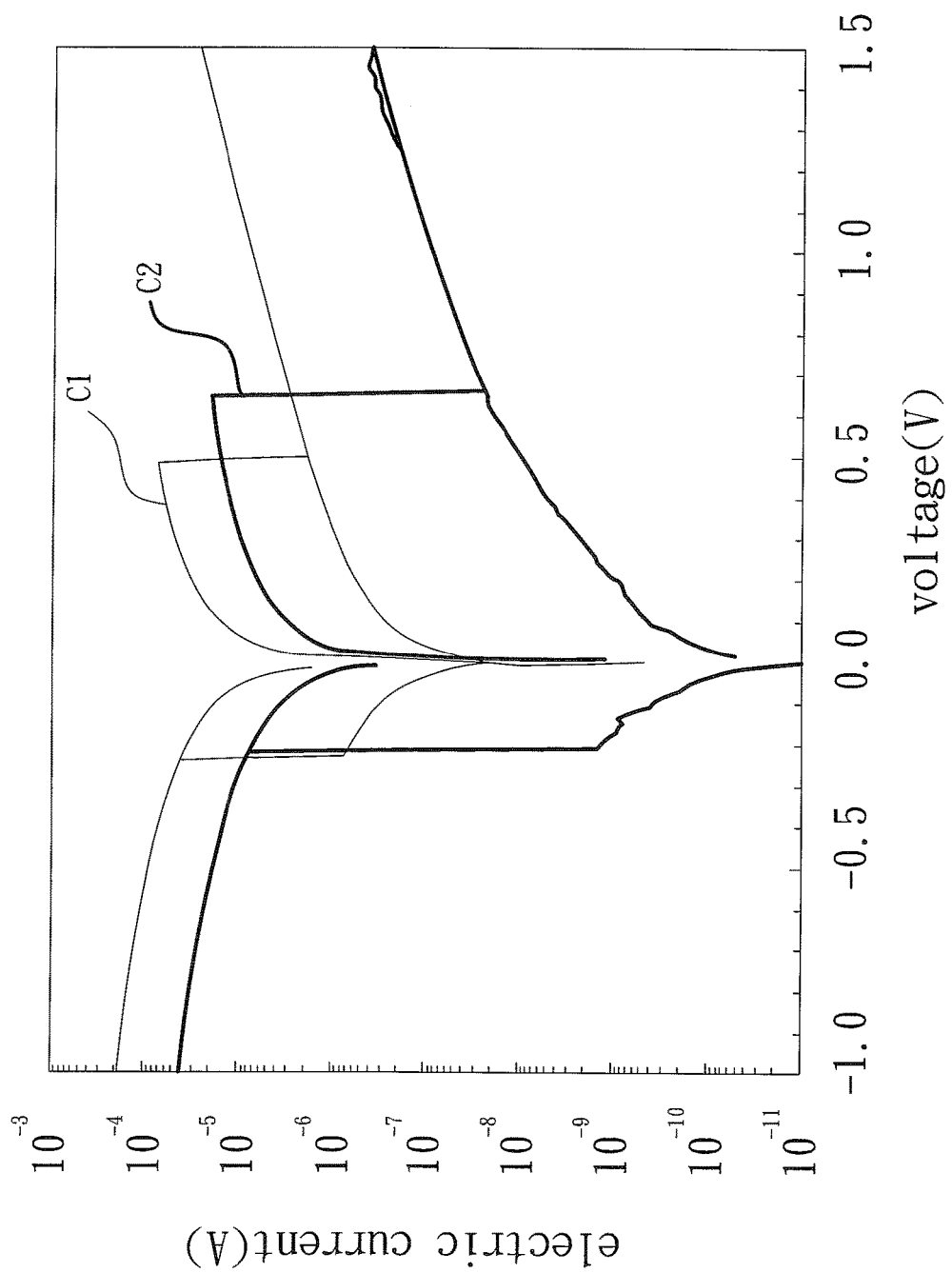
FIG. 2 shows the characteristic curves of the conventional resistive random access memory and the resistive random access memory of the embodiment of the disclosure.

FIG. 2 shows the characteristic curves of the conventional resistive random access memory and the resistive random access memory of the embodiment of the disclosure. The conventional resistive random access memory is labeled as C1 (the resistance changing layer contains only an oxide), and the resistive random access memory of the embodiment of the disclosure is labeled as C2 (the resistance changing layer contains the heavy element of gadolinium in addition to the oxide). It can be observed from the characteristic curves C1 and C2 that, after a predetermined number of times of operation, the values of the electric currents of the conventional resistive random access memory at high and low resistance states are too close to each other. As a result, an incorrect determination of the resistance state can result, leading to low reliability. In contrast, for the resistive random access memory of the embodiment of the disclosure, the characteristic curve C2 shows that the values of the electric currents at high and low resistance states are distinct from each other. As such, a correct determination of the resistance state can be ensured, and higher reliability and prolonged service life can be attained. Thus, the problem of low reliability of the conventional resistive random access memory can be overcome.

Based on the above, since each electrode layer of the resistive random access memory of the disclosure includes a doping area that contains a heavy element, the resistive random access memory can be protected from damage caused by the oxygen ions of the resistance changing layer. As such, the reliability is improved.

Although the invention has been described in detail with reference to its presently preferable embodiments, it will be understood by one of ordinary skill in the art that various modifications can be made without departing from the spirit and the scope of the invention, as set forth in the appended claims.

What is claimed is:

1. A resistive random access memory comprising:
   a resistance changing layer having a first face and a second face opposite to the first face, wherein the resistance changing layer is switchable between a high resistance state and a low resistance state; and
   a first electrode layer and a second electrode layer respectively coupled with the first face and the second face of the resistance changing layer, wherein the first electrode layer directly abuts the first face of the resistance changing layer, wherein the second electrode layer directly abuts the second face of the resistance changing layer, wherein each of the first electrode layer and the second electrode layer comprises a doping area containing a heavy element and a non-doping area, wherein the doping area of the first electrode layer is located between the non-doping area of the first electrode layer and the resistance changing layer, wherein the doping area of the second electrode layer is located between the non-doping area of the second electrode layer and the resistance changing layer, wherein the doping area of the first electrode layer directly abuts the first face of the resistance changing layer, wherein the doping area of the second electrode layer directly abuts the second face of the resistance changing layer, and wherein the resistance changing layer is sandwiched between the doping areas of the first electrode layer and the second electrode layer.

2. The resistive random access memory as claimed in claim 1, wherein the doping area of the first electrode layer is in a form of a layer having a thickness smaller than a thickness of the non-doping area of the first electrode layer, and wherein the doping area of the second electrode layer is in a form of a layer having a thickness smaller than a thickness of the non-doping area of the second electrode layer.

3. The resistive random access memory as claimed in claim 1, wherein the heavy element is lanthanum, cerium, praseodymium, neodymium, promethium, samarium, europium, gadolinium, terbium, dysprosium, holmium, erbium, thulium, ytterbium, lutetium, hafnium, tantalum, tungsten, rhenium, osmium, iridium, platinum, gold, mercury, thallium, plumbum or any combination thereof.

4. The resistive random access memory as claimed in claim 1, wherein each of the first electrode layer and the second electrode layer is a multi-layer structure.

* * * * *